(12) United States Patent
Yoshino

(10) Patent No.: US 7,460,405 B2
(45) Date of Patent: Dec. 2, 2008

(54) METHOD FOR CONTROLLING NONVOLATILE MEMORY DEVICE

(75) Inventor: Akira Yoshino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 241 days.

(21) Appl. No.: 11/486,295

(22) Filed: Jul. 14, 2006

(65) Prior Publication Data

US 2007/0014155 A1    Jan. 18, 2007

(30) Foreign Application Priority Data

Jul. 15, 2005 (JP) .............................. 2005-206711

(51) Int. Cl.
*G11C 11/34* (2006.01)

(52) U.S. Cl. .............................. 365/185.18; 365/185.17; 365/185.14

(58) Field of Classification Search ............ 365/185.18, 365/185.17, 185.14, 185.27, 185.26, 185.33, 365/189.09
See application file for complete search history.

(56) References Cited

U.S. PATENT DOCUMENTS 7,057,931 B2 * 6/2006 Lutze et al. ............ 365/185.18

2002/0067641 A1 * 6/2002 Ogura et al. ........... 365/185.29

FOREIGN PATENT DOCUMENTS

JP    05-129564    5/1993
JP    2003-017600    1/2003

OTHER PUBLICATIONS

An Experimental 4-Mbit CMOS EEPROM with a NAND-Structured Cell, Masaki Momodomi et al, IEEE Journal of Solid-State Circuits, vol. 24, No. 5, Oct. 1989.

* cited by examiner

*Primary Examiner*—Dang T Nguyen
(74) *Attorney, Agent, or Firm*—Young & Thompson

(57) ABSTRACT

Data is written to a nonvolatile memory device having a memory region of four bits or larger in one memory cell sandwiched by a source and a drain with an improved accuracy. The nonvolatile memory device 100 includes four control gates 114 to 117 provided between a first and a second impurity-diffused regions 106a and 160b that are provided separately from the semiconductor substrate, and a memory cell including memory regions 106a to 106d that are counterpart of the control gates. A method for controlling the nonvolatile memory device 100 includes classifying the four control gates 114 to 100 into two groups of right and left sides, and then, applying a lower voltage to an impurity-diffused region that is further from a target memory region for injecting an electron and applying a higher voltage to an impurity-diffused region that is closer the target memory region, and moreover applying a higher voltage, the higher voltage being higher than voltages applied to other control gates.

13 Claims, 11 Drawing Sheets

|   | DATA CODE | INITIAL VALUE | ($V_S$=0 V, $V_D$=4.5 V) | ($V_S$=4.5 V, $V_D$=0 V) |
|---|---|---|---|---|
| 1 | 1110 | 1111 | → 1110 | |
| 2 | 1101 | 1111 | → 1101 | |
| 3 | 1100 | 1111 | → 1101 → 1100 | |
| 4 | 0110 | 1111 | → 1110 | → 0110 |
| 5 | 0101 | 1111 | → 1101 | → 0101 |
| 6 | 1001 | 1111 | → 1101 | → 1001 |
| 7 | 0100 | 1111 | → 1101 → 1100 | → 0100 |
| 8 | 1000 | 1111 | → 1101 → 1100 | → 1000 |
| 9 | 0000 | 1111 | → 1101 → 1100 | → 1000 → 0000 |

FIG. 8

| DATA CODE / APPLIED VOLTAGE | | $V_S$ (V) | $V_D$ (V) | $V_{CG1}$ (V) | $V_{CG2}$ (V) | $V_{CG3}$ (V) | $V_{CG4}$ (V) |
|---|---|---|---|---|---|---|---|
| 1 | 1111 → 1110 | 0 | 4.5 | 1.5 | 3.0 | 3.0 | 12.0 |
| 2 | 1111 → 1101 | 0 | 4.5 | 1.6 | 2.0 | 12.0 | 6.0 |
| 3 | 1101 → 1100 | 0 | 4.5 | 1.5 | 3.0 | 3.0 | 12.0 |
| 4 | 1110 → 0110 | 4.5 | 0 | 12.0 | 3.0 | 3.0 | 2.6 |
| 5 | 1101 → 0101 | 4.5 | 0 | 12.0 | 3.0 | 3.0 | 1.5 |
| 6 | 1101 → 1001 | 4.5 | 0 | 6.0 | 12.0 | 2.0 | 1.8 |
| 7 | 1100 → 0100 | 4.5 | 0 | 12.0 | 3.0 | 3.0 | 2.8 |
| 8 | 1100 → 1000 | 4.5 | 0 | 6.0 | 12.0 | 3.0 | 2.5 |
| 9 | 1000 → 0000 | 4.5 | 0 | 12.0 | 3.0 | 3.0 | 3.0 |

METHOD FOR CONTROLLING NONVOLATILE MEMORY DEVICE

This application is based on Japanese patent application No. 2005-206,711, the content of which is incorporated hereinto by reference.

BACKGROUND

1. Field of The Invention

The present invention relates to a method for controlling a nonvolatile memory device having a memory region of four bits or larger in one memory cell sandwiched by a source and a drain.

2. Related Art

An NAND (not and) nonvolatile memory device having a plurality of memory regions and a plurality of counterpart control gates, which are all disposed between a source and a drain, is known in the conventional technology.

A type of NAND cell that conducts writing data by utilizing tunneling current is disclosed by Masaki Momodomi et al., in "An Experimental 4-Mbit CMOS EEPROM with a NAND-Structured Cell", IEEE Journal of solid-state circuits, vol. 24, No. 5, 1989, pp. 1238 to 1243, and is also disclosed in Japanese Patent Laid-Open No. H5-129,564 (1993). In Japanese Patent Laid-Open No. H5-129,564, a nonvolatile memory device having a configuration that does not include an impurity diffusion layer provided among a plurality of memory regions (and control gates) is disclosed. FIG. 10 is a circuit schematic of a nonvolatile memory device described in Japanese Patent Laid-Open No. H5-129,564. A transistor Q1 includes a plurality of gate electrodes CG1 to CG8. One end of source/drain of a transistor Q2 is grounded, and another end is coupled to the transistor Q1. One end of a transistor Q3 is applied with an electrical voltage VDD, and another end is coupled to the transistor Q1.

Writing data on the nonvolatile memory device having such configuration by utilizing tunneling current is conducted as follows. When data is, for example, written on a gate electrode CG5, electrical voltages across a gate electrode AG1 of the transistor Q2 and gate electrodes CG1 to CG4 of the transistor Q1 are set to be low (at 0 V), providing a status of OFF. Further, electrical voltages across a gate electrode AG2 of Q3 and gate electrodes CG6 to CG8 of the transistor Q1 are set to be high (at 5 V), providing a status of ON. Then, a higher voltage of 20 V is applied to the gate electrode CG5 for a certain time to cause a Fowler-Nordheim (FN) current injection, thereby injecting electron into a nitride film in vicinity of this electrode. This process achieves data stored in the control electrode CG5. Since the gate electrode AG1 and the gate electrodes CG1 to CG4 are the status of OFF in this occasion, no through current flows from the power supply to the ground.

On the other hand, a type of NAND cell of a configuration having no selector gate is disclosed by Fujio Masuoka et al., "New Ultra High Density EPROM and Flash EEPROM with NAND Structure Cell", IEDM 87, 1987, pp. 552 to 555. Impurity diffusion layers are provided among a plurality of memory regions (and control gates) of such cell. Further, this cell is composed of four memory transistors, which are connected in series, and each of these memory transistors has a structure, in which a floating gate (FG) (made of poly Si film) is buried in a gate oxide film of a negative polarity metal oxide semiconductor (NMOS) transistor. Writing data on the cell having such configuration is conducted by injecting a channel hot electron (CHE) through the following procedure. First of all, an electrical voltage of 9 V is applied to a bit line coupled to a memory transistor located in one end thereof. A memory transistor located in another end is grounded. Here, an electrical voltage of 10 V is applied to a control gate, which is a counterpart to a memory region selected as a data-written medium, and higher electrical voltage of 20 V is applied to the other control gate, which is a counterpart to a memory region that is not selected as a data-written medium. By such application of higher electrical voltage, the electrical voltage that has been applied to the bit line is applied to an impurity-diffused regions in each side of the selected control gate via a inversion layer formed at each of the memory transistor by so-called virtual-drain-effect and a hot electron is generated in a channel region located under the selected control gate, and eventually an electron is injected into a floating gate located under the control gate.

Further, a storage cell that is configured to include a control gate and a floating gate, which are disposed in series between a source and a drain, is disclosed in M. Kamiya et al., "EPROM CELL WITH HIGH GATE INJECTION EFFICIENCY", IEDM 82, 1982, p. 741 to 744. In such storage cell, the control gate and the floating gate are arranged in this order between the source and the drain, and a higher voltage is applied to the drain and a lower voltage is applied to the source, and further a higher voltage, which is higher than the voltage applied to the control gate, is applied to the floating gate, so that a hot electron generated in the higher electric field region in vicinity of a boundary between the control gate and the floating gate is injected to the floating gate from the side of the source (source-side-injection or perpendicularly accelerating channel (PAC) injection).

On the other hand, Japanese Patent Laid-Open No. 2003-17,600 discloses a nonvolatile memory device including a first and a second memory cells, which are connected between a pair of bit lines. It is described that, when one of the first and the second memory cells of such nonvolatile memory device functions as a data cell for storing data, the other functions as a selected cell.

In the meantime, a miniaturization of nonvolatile memory devices is generally expected in the industry, and in such circumstances, when the configuration of utilizing FN current injection is employed, it is necessary to provide the gate electrode AG1 of the transistor Q2 or the gate electrode AG2 of the transistor Q3, as shown in FIG. 10 for example, in addition to providing the gate electrodes CG1 to CG8 corresponding to respective memory regions, causing a problem of opposing the requirement of miniaturization.

Consequently, the present inventors have investigated a process for writing data onto a target memory region via a CHE injection. Although the above-described Masuoka et al discloses a technology for writing data on the memory cell by utilizing the CHE injection, the configuration of Masuoka et al. includes additional impurity-diffused regions respectively formed between each of the memory regions. In this regard, miniaturization of the cell is obstructed. In addition, the method for injecting electron disclosed by Masuoka et al. utilizes virtual-drain-effect, and thus, when the size of the cell is reduced to have shorter channel-length of each bit, leakage current due to a punchthrough is increased. In addition, since the injection of electron to the memory region is implemented for larger area in an ordinary CHE injection, it is difficult to selectively inject electron only in the target memory region in this process, when the size of the gate length of the control gate is reduced. In this regard, miniaturization of the cell can not be achieved by employing the process of Masuoka et al.

On the other hand, when the source-side injection disclosed by M. Kamiya et al., "EPROM CELL WITH HIGH GATE INJECTION EFFICIENCY", IEDM 82, 1982, p. 741 to 744 is employed, an electron can be selectively injected within a desired very small region of the memory region. When only two control gates between the source and the drain are employed as in the configuration of the aforementioned Masuoka et al., the source-side injection can be achieved by applying an appropriate electrical voltage to the two control gates, so that these control gates function as a gate for selecting the target memory region for writing data and a gate for controlling a level of electron current, respectively.

Nevertheless, when number of control gates disposed between the source and the drain is further increased in the conventional configuration, no countermeasure for injecting electron by the source-side injection process has not been examined.

SUMMARY OF THE INVENTION

When four or more control gates are disposed between the source and the drain, both sides of the control gate that is the counterpart to the target memory region for writing data are provided with other control gate in the process for writing data on, for example, the inner memory region that is sandwiched between other memory region. Therefore, when electron is to be injected in either memory region, there are larger number of combinations of electrical voltages respectively applied to the impurity-diffused region and a plurality of control gates, and the optimized combination must be selected according to the object. The present inventor has conducted investigations for obtaining the optimized electrical voltages.

According to one aspect of the present invention, there is provided a method for controlling a nonvolatile memory device, the nonvolatile memory device comprising:

a semiconductor substrate; and a memory cell including:

first and second impurity-diffused regions provided separately and spaced from each other at the surface of the semiconductor substrate;

first to Nth control gates, where N is an even number of not smaller than four, being disposed in parallel with each other between the first impurity-diffused region and the second impurity-diffused region in this order on the semiconductor substrate; and first to Nth memory regions, respectively being provided between the semiconductor substrate and the first to the Nth control gates, the method comprising:

(a) classifying the first to Nth control gates into a first control gate group composed of first to N/2th control gates arranged in a side of the first impurity-diffused region and a second control gate group composed of (N/2+1)th to Nth control gates arranged in a side of the second impurity-diffused region, and then applying a first higher voltage to the first impurity-diffused region and applying a first lower voltage to the second impurity-diffused region when a target control gate corresponding to a target memory region for injecting an electron is included in the first control gate group, and applying a second lower voltage to the first impurity-diffused region and applying a second higher voltage to the second impurity-diffused region when the target control gate is included in the second control gate group; and (b) applying a third higher voltage to the target control gate, while the condition of applying the voltages to the first and the second impurity-diffused regions is maintained, so that electron is injected to the target memory region that is corresponding to the target control gate, the third higher voltage being higher than voltages applied to other control gates.

The present inventor has examined a number of combinations of electrical voltages, and eventually found that a punchthrough in the process of writing data can be inhibited by suitably controlling electrical voltages applied to the first and the second impurity-diffused regions according to the above-described step (a). More specifically, it is found that a punchthrough can be inhibited to reduce a leakage current by providing a distance between the impurity-diffused region applied with lower voltage included in the first and the second impurity-diffused regions and the target memory region to be longer as possible, when electron is injected in the target memory region by a source side injection process. This configuration provides an inhibition to the punchthrough in the process for writing data, thereby achieving an injection of an electron to a desired memory region with an improved accuracy.

The method for controlling a nonvolatile memory device according to the above-described aspect of the present invention may further include a configuration, in which the first to Nth control gates in the nonvolatile memory device are arranged to be mutually adjacent, between which only an insulating film is disposed.

According to such method for controlling the nonvolatile memory device of the present invention, a selective injection of an electron to a target memory element can be achieved with an improved controllability, even in the case of employing the nonvolatile memory device having a miniaturized dimension. Therefore, a desired data code can also be established in a memory cell of a nonvolatile memory device having a configuration including no impurity-diffused region between memory devices.

Further, according to such method for controlling the nonvolatile memory device of the present invention, data can be stored in each of the memory cells, depending on data code for being stored in each of the memory cells. Here, an algorithm of a sequence for multiple-step electron injection may be previously established, so that the electrical voltage applied to a control gate of a non-selected bit can be optimized depending on a status of capturing electron by each bit in each of the process steps. This configuration can achieve reducing a power consumption in each of the process steps of the process for injecting an electron and increasing a speed of a writing rate.

When four or more memory regions (or four or more bits) are arranged between the source and the drain, electrical voltage applied to the control gates must be optimized depending on the status of capturing electron by the non-selected bit in the writing process (writing condition), in order to efficiently utilize characteristics of the source side injection process such as achieving writing with lower current, higher efficiency in injecting electron, selective injection of electron into a smaller region and the like. Since the sequence of injecting an electron to the memory regions is suitably determined according to the present invention, a reduction of an electric power consumption in each of the process steps of the process for injecting an electron and an increase of a speed of a writing rate can be achieved.

According to the present invention, a punchthrough occurred in a operation of writing data to a nonvolatile memory device having a memory region of four bits or larger in one memory cell sandwiched by a source and a drain can be inhibited, and an injection of an electron to a desired memory region can be achieved with an improved accuracy.

BRIEF DESCRIPTION OF THE DRAWINGS

The above and other objects, advantages and features of the present invention will be more apparent from the following description taken in conjunction with the accompanying drawings, in which:

FIG. 6 shows a table, including data codes in 4 bits/cell;

FIG. 7 shows a table, including data codes to be written to memory cells and procedures for injecting electron to each of memory regions;

FIG. 8 shows a table, including relationships between procedures for generating various data codes and corresponding electrical voltage applied to respective control gates;

DETAILED DESCRIPTIONS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

Figure 1:
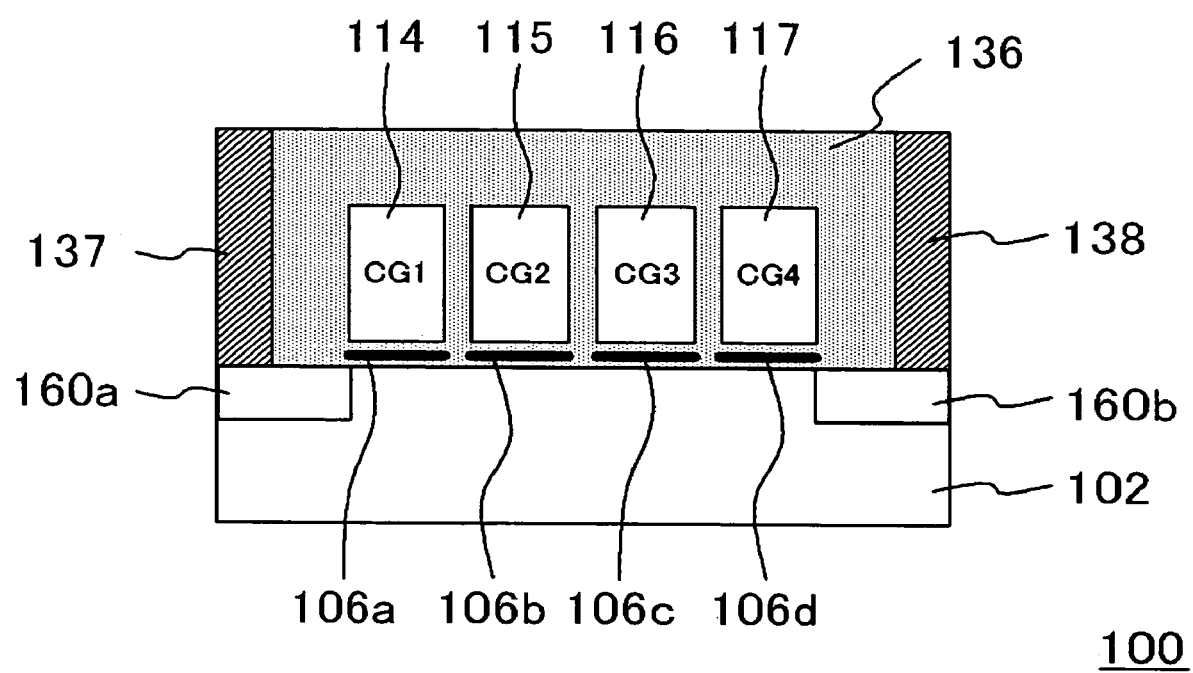
FIG. 1 is a cross-sectional view, showing a configuration of a nonvolatile memory device in an embodiment according to the present invention.

FIG. 1 is a cross-sectional view, showing a configuration of a nonvolatile memory device according to the present embodiment. In the present embodiment, a nonvolatile memory device 100 includes four memory regions 106a to 106d, and control gates 114 to 117 that are counterparts to these memory regions 106a to 106d, respectively, and further, four-bit data can be stored in one memory cell.

The nonvolatile memory device 100 includes: a first impurity-diffused region 160a and a second impurity-diffused region 160b, both of which are formed separately from each other at a surface of a silicon substrate 102 (semiconductor substrate); a first control gate 114, a second control gate 115, a third control gate 116 and a fourth control gate 117, all of which are disposed adjacent to each other at a channel region provided between the first impurity-diffused region 160a and the second impurity-diffused region 160b; an insulating film 136 for covering these control gates; and a metallic interconnect 137 and a metallic interconnect 138, provided in the insulating film 136 so as to be provided to be connected to the first impurity-diffused region 160a and the second impurity-diffused region 160b, respectively. Here, a conductivity type of the silicon substrate 102 is p-type, and a conductivity type of the first impurity-diffused region 160a and the second impurity-diffused region 160b is n-type.

In addition, a first memory region 106a, a second memory region 106b, a third memory region 106c and a fourth memory region 106d are provided under the first control gate 114, the second control gate 115, the third control gate 116 and the fourth control gate 117, respectively, and above the silicon substrate 102.

In the present embodiment, the first memory region 106a, the second memory region 106b, the third memory region 106c and the fourth memory region 106d are composed of multi-layered films, which are formed by providing an under layer silicon oxide film, a silicon nitride film and an upper layer silicon oxide film in this sequence. An insulating film 136 composed of a material such as, for example, a high-temperature-oxide (HTO) film and the like, is provided to fill the intervals between the first control gate 114 and the second control gate 115, between the second control gate 115 and the third control gate 116, and between the third control gate 116 and the fourth control gate 117. This configuration provides respective insulations of the first to the fourth control gates 114 to 117.

The first control gate 114, the second control gate 115, the third control gate 116 and the fourth control gate 117 may be composed of, for example, polycrystalline silicon. In the present embodiment, electric potentials in the first control gate 114, the second control gate 115, the third control gate 116 and the fourth control gate 117 are independently controlled.

Next, a method for controlling the nonvolatile memory device 100 in the present embodiment will be described. First of all, a procedure for writing data to the first memory region 106a, the second memory region 106b, the third memory region 106c and the fourth memory region 106d, respectively will be described. In the present embodiment, the process of writing data is achieved by conducting a source side injection. Here, writing data means an injection of electron.

In the present embodiment, the method for controlling the nonvolatile memory device 100 during the writing data includes:

(a) classifying four control gates into a first control gate group consisting of two control gates in the side of the first impurity-diffused region 160a (the first control gate 114 and the second control gate 115) and a second control gate group consisting of two control gates in the side of the second impurity-diffused region 160b (the third control gate 116 and the fourth control gate 117), and applying a higher voltage to the first impurity-diffused region 160a and applying a lower voltage to the second impurity-diffused region 160b if a target control gate that is a counterpart to a target memory region for being injected with electron is included in the first control gate group, and applying a lower voltage to the first impurity-diffused region 160a and applying a higher voltage to the second impurity-diffused region 160b if the target control gate is included in the second control gate group; and (b) applying a higher voltage to the target control gate, while the condition of applying the aforementioned voltages to the first impurity-diffused region 106a and the second impurity-diffused region 160b is maintained, so that electron is injected to the memory region that is counterpart to the target control gate, the higher voltage being higher than voltages applied to other control gates.

In addition, in the present embodiment, the method for controlling the nonvolatile memory device 100 during the writing data further includes:

(c) determining a sequence for injecting electron to the plurality of memory regions, when injecting electron to the plurality of memory regions is required corresponding to data code for being stored in the memory cell; and (d) sequentially selecting a target memory region for being injected with electron from the plurality of memory regions, according to sequence determined in the step (c), and the step (a) and the step (b) are conducted over the memory region selected in the step (d).

First of all, the above-described operation (a) and the operation (b) will be described. FIG. 2A to FIG. 2D are cross-sectional views of the semiconductor device, schematically illustrating a flow of electron when data is written to a memory region, which is a counterpart to either one of the first to the fourth control gates 114 to 117. FIG. 3A to FIG. 3D are circuit schematic corresponding to the devices shown in FIG. 2A to FIG. 2D, respectively. Descriptions will be made in reference to FIG. 2A to FIG. 2D and FIG. 3A to FIG. 3D. Here, for the purpose of simplifying the following descriptions, an exemplary implementation of a case where all the initial state of four memory regions are in erase condition will be described. Hereinafter, a control gate that is a counterpart to the target control memory region for writing data is referred to as a target gate, and a control gate for controlling a magnitude of electron current is referred to as a magnitude control gate.

Figure 2A:
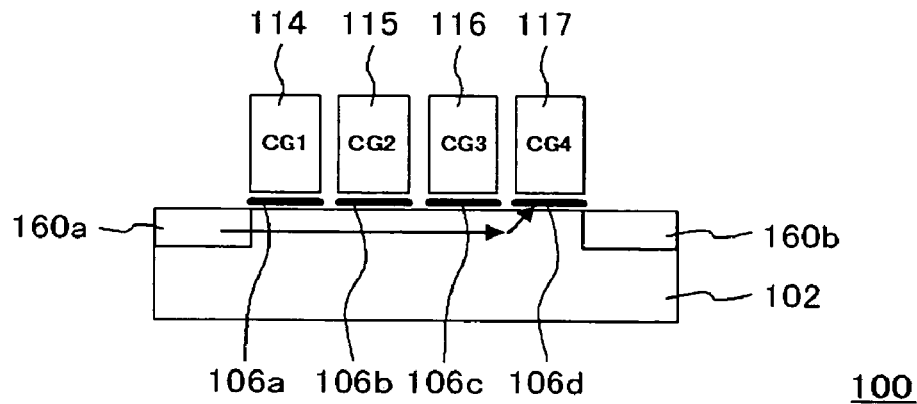
FIGS. 2A to 2D are schematic cross-sectional views of a semiconductor device, illustrating a flow of an electron when data is written to a memory region disposed under any of the control gates.

FIG. 2A is a schematic cross-sectional view of a semiconductor device, illustrating a flow of an electron when data is written to the fourth memory region 106d disposed under the fourth control gate 117.

Since the fourth control gate 117 is categorized as a member of the second control gate group in this case, a lower voltage is applied to the first impurity-diffused region 160a, and a higher voltage is applied to the second impurity-diffused region 160b. More specifically, as show n in, for example, FIG. 3A, an electrical voltage applied to the second impurity-diffused region 160b is set to 4.5 V, and an electrical voltage applied to the first impurity-diffused region 160a is set to 0 V. At this time, the silicon substrate 102 is grounded.

Moreover, an electrical voltage applied to the fourth control gate 117 that is a target gate is set to 12.0 V. In this case, the first control gate 114, the second control gate 115 and the third control gate 116 are located to be closer to the first impurity-diffused region 160a than the fourth control gate 117, and therefore appropriate electrical voltages to applied to the control gates 114, 115, and 116 are determined in order to have these control gates 114, 115, and 116 function as the magnitude control gates.

Energy barrier height of a p-n junction composed of the first impurity-diffused region 160a and the p-type silicon substrate 102 and a surface potential right under the first memory region 106a is controlled by an electrical voltage applied to the first control gate 114. Accordingly, in order to control writing current at a desired value (for example, at 1 μA/cell), number of electrons exceeding energy barrier of the above-described p-n junction to flow into an inverted layer right under the first control gate 114 must be adequately controlled by suitably establishing electrical voltage of the first control gate 114. Next, in order to bring electron flowed into the inverted layer right under the first control gate 114 to an inverted layer in vicinity of a boundary between the third memory region 106c and the fourth memory region 106d, a surface potential of a portion of the silicon substrate 102 right under the second memory region 106b and the third memory region 106c must be suitably controlled to adequately control electron concentration in the inverted layer under these regions (more specifically, parasitic resistance of these regions). Further, in order to enhance an efficiency in the injection of an electron efficiency and to achieve the injection of electron in a narrower region of the fourth memory region 106d, it is preferable to have a profile of the surface potential that includes a sudden change in vicinity of the boundary between the third memory region 106c and the fourth memory region 106d. Accordingly, levels of the electrical voltages applied to the first to the third control gate 114 to 116 must be optimized in view of the above-described electron injection mechanism. For example, electrical voltages applied to the first control gate 114, the second control gate 115 and the third control gate 116 are set to 1.5 V, 3.0 V and 3.0 V, respectively.

When electrical voltages set to these control gates as described above are applied thereto, the first impurity-diffused region 160a functions as a source and the second impurity-diffused region 160b functions as a drain, and an electron is transported toward a direction from the first impurity-diffused region 160a to the second impurity-diffused region 160b. Since the electric potential in the surface of the silicon substrate 102 surges on the boundary between the third control gate 116 and the fourth control gate 117, an electron flowed from the channel region under the third control gate 116 into the channel region under the fourth control gate 117 is rapidly accelerated toward a transverse direction to be excited at a higher energy level, and is simultaneously accelerated toward a generally vertical direction by a strong vertical electric field generated by applying an voltage (12 V) to the fourth control gate 117, thereby causing an injection of the accelerated electron into the fourth memory region 106d (narrower region near a region right under the left edge [in the diagram] of the fourth control gate 117).

Figure 2B:
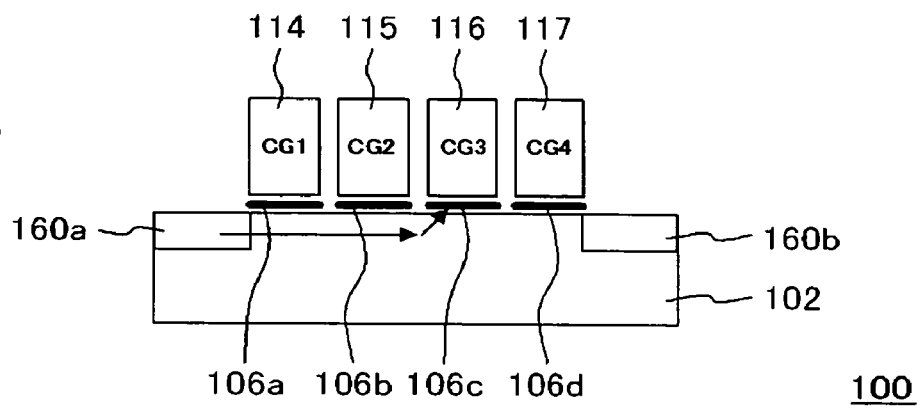

FIG. 2B is a schematic cross-sectional view of a semiconductor device, illustrating a flow of an electron when data is written to the third memory region 106c disposed under the third control gate 116.

Since the third control gate 116 is categorized as a member of the second control gate group in this case, a lower voltage is applied to the first impurity-diffused region 160a, and a higher voltage is applied to the second impurity-diffused region 160b. More specifically, as shown in, for example, FIG. 3B, an electrical voltage applied to the second impurity-diffused region 160b is set to 4.5 V, and an electrical voltage applied to the first impurity-diffused region 160a is set to 0 V.

Moreover, an electrical voltage applied to the third control gate 116 that is a target gate is set to 12.0 V. In this case, the first control gate 114 and the second control gate 115 are located to be closer to the first impurity-diffused region 160a than the third control gate 116, and therefore appropriate electrical voltages to applied to these control gates 114 and 115 are determined in order to have these control gates 114 and 115 function as the magnitude control gates. Here, electrical voltages applied to the first control gate 114 and the second control gate 115 are set to 1.5 V and 3.0 V, respectively.

Further, the fourth control gate 117 is located to be closer to the second impurity-diffused region 160b than the third control gate 116, and therefore an appropriate electrical voltage applied to the fourth control gate 117 is selected so that electron be selectively injected only in the third memory region 106c under the third control gate 116. An electrical voltage applied to the fourth control gate 117 may be selected as, for example, about half of the electrical voltage applied to the third control gate 116. Here, an electrical voltage applied to the fourth control gate 117 is set to 6.0 V.

When electrical voltages set to these control gates as described above are applied thereto, the first impurity-diffused region 160a functions as a source and the second impurity-diffused region 160b functions as a drain, and an electron is transported toward a direction from the first impurity-diffused region 160a to the second impurity-diffused region 160b. Since the electric potential in the surface of the silicon substrate 102 surges on the boundary between the second control gate 115 and the third control gate 116, an electron flowed from the channel region under the second control gate 115 into the channel region under third control gate 116 is rapidly accelerated toward a transverse direction to be excited at a higher energy level, and then is injected into the third memory region 106c, similarly as described above.

Since a region right under the control gate 117 is in a strong inversion in this time, the surface potential thereof is fixed at a value that is closer to an electric potential of the second impurity diffusion layer 160b (4.5 V). Accordingly, electrical potential difference between the control gate 117 and a portion of the surface of the silicon substrate 102 right under the control gate 117 is a lower value of not higher than about 2 V, and thus a hot electron generated in vicinity of the boundary between the control gate 115 and the control gate 116 is not injected in the fourth memory region 106d. Similarly, injection of electron into the first memory region 106a and/or the second memory region 106b is not also occurred.

Figure 2C:
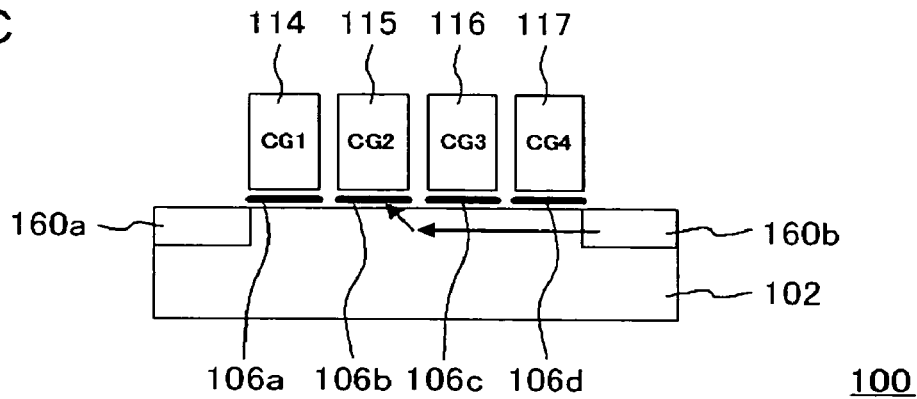

FIG. 2C is a schematic cross-sectional view of a semiconductor device, illustrating a flow of an electron when data is written to the second memory region 106b disposed under the second control gate 115.

In this case, a voltage-applying pattern that is reverse of the pattern for writing data onto the third memory region 106c is established. More specifically, since the second control gate 115 is categorized as a member of the first control gate group, a higher voltage is applied to the first impurity-diffused region 160a, and a lower voltage is applied to the second impurity-diffused region 160b. More specifically, as show in, for example, FIG. 3C, an electrical voltage applied to the first impurity-diffused region 160a is set to 4.5 V, and an electrical voltage applied to the second impurity-diffused region 160b is set to 0 V. At this time, the silicon substrate 102 is grounded.

Moreover, an electrical voltage applied to the second control gate 115 that is a target gate is set to 12.0 V. In this case, the third control gate 116 and the fourth control gate 117 are located to be closer to the second impurity-diffused region 160b than the second control gate 115, and therefore appropriate electrical voltages to be applied to these control gates 116a and 117 are determined in order to have these control gates 116a and 117 function as the magnitude control gates. Further, an appropriate electrical voltage applied to the first control gate 114 is selected so that electron is selectively injected only in the second memory region 106b. Here, electrical voltages applied to the first control gate 114, the third control gate 116 and the fourth control gate 117 are set to 6.0 V, 3.0 V and 1.5 V, respectively.

When electrical voltages set to these control gates as described above are applied thereto, an electron is transported to the second impurity-diffused region 160b by a mechanism similar to that for injecting electron to the third memory region 106c described above.

Figure 2D:
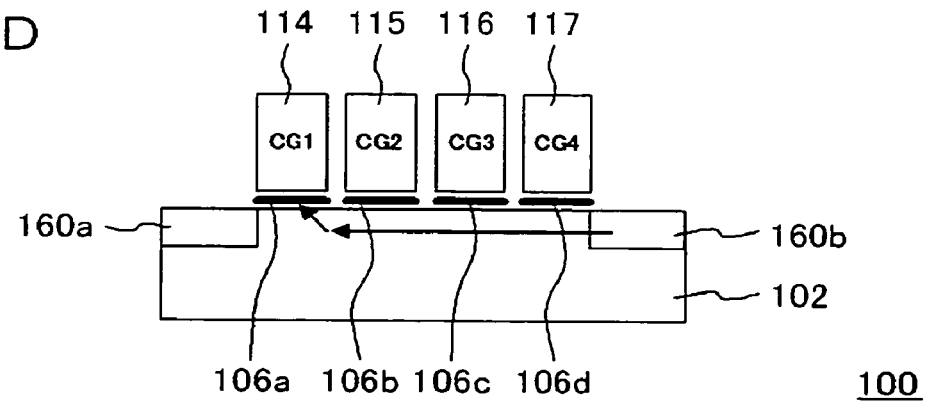
Figure 3A:
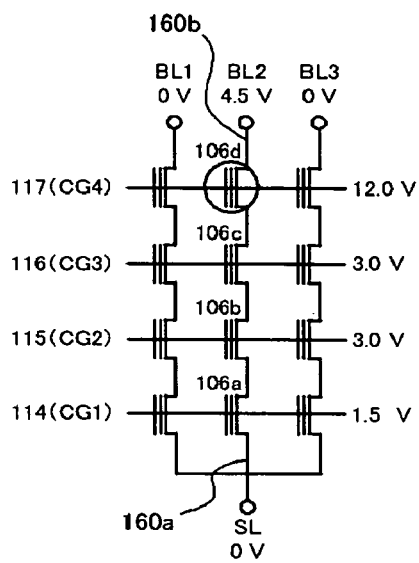
FIG. 3A to FIG. 3D are circuit schematic corresponding to the devices shown in FIG. 2A to FIG. 2D, respectively.
Figure 3B:
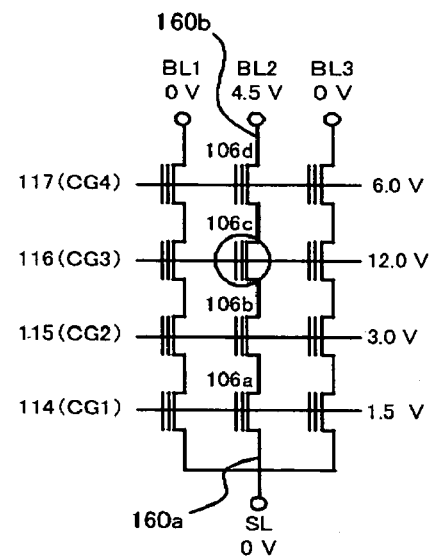
Figure 3C:
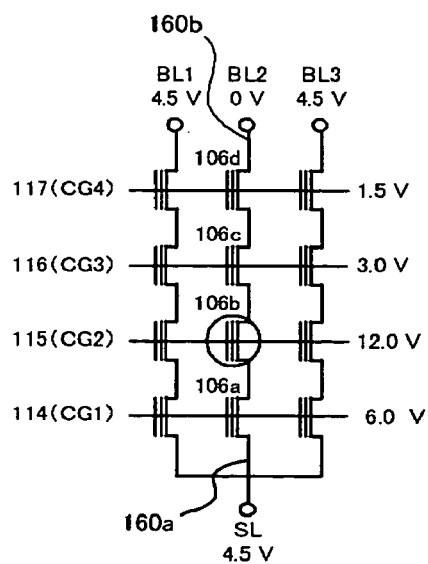
Figure 3D:
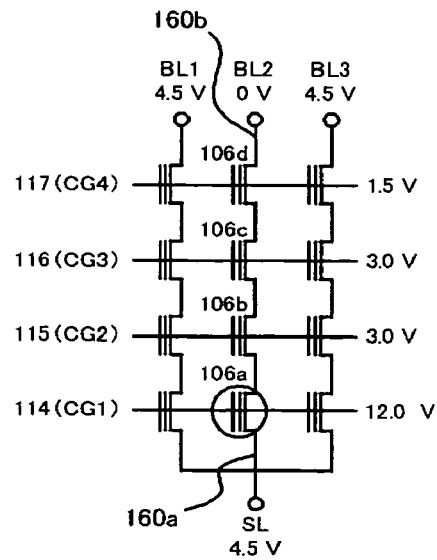

FIG. 2D is a schematic cross-sectional view of a semiconductor device, illustrating a flow of an electron when data is written to the first memory region 106a disposed under the first control gate 114.

Since the first control gate 114 is categorized as a member of the first control gate group, a higher voltage is applied to the first impurity-diffused region 160a, and a lower voltage is applied to the second impurity-diffused region 160b. More specifically, as show in, for example, FIG. 3D, an electrical voltage applied to the first impurity-diffused region 160a is set to 4.5 V, and an electrical voltage applied to the second impurity-diffused region 160b is set to 0 V. At this time, the silicon substrate 102 is grounded.

Moreover, an electrical voltage applied to the first control gate 114 that is a target gate is set to 12.0 V. In this case, the second control gate 115, the third control gate 116 and the fourth control gate 117 are located to be closer to the second impurity-diffused region 160b than the first control gate 114, and therefore appropriate electrical-voltages to be applied to these control gates 115, 116, and 117 are determined in order to have these control gates 115, 116, and 117 function as the magnitude control gates. In such case, electrical voltages applied to the second control gate 115, the third control gate 116 and the fourth control gate 117 are set to 3.0 V, 3.0 V and 1.5 V, respectively.

When electrical voltages set to these control gates as described above are applied thereto, an electron is transported to the first impurity-diffused region 160a by a mechanism similar to that for injecting electron to the fourth memory region 106d described above.

Next, procedures for determining a setting for applying an electrical voltage to the fourth control gate 117 will be described in reference to an exemplary implementation of writing data to the third memory region 106c.

Figure 4A:
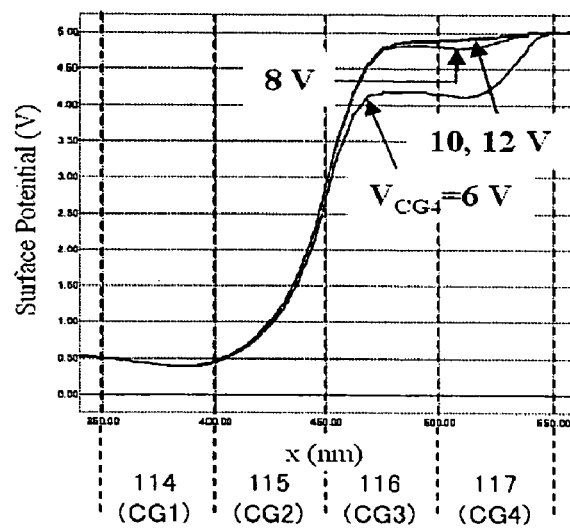
FIG. 4A to FIG. 4C are graphs, showing results of device simulations, which are conducted for investigating an electric potential distribution and a field strength distribution in the nonvolatile memory device during the process for writing data onto the memory region under an inner control gate.
Figure 4B:
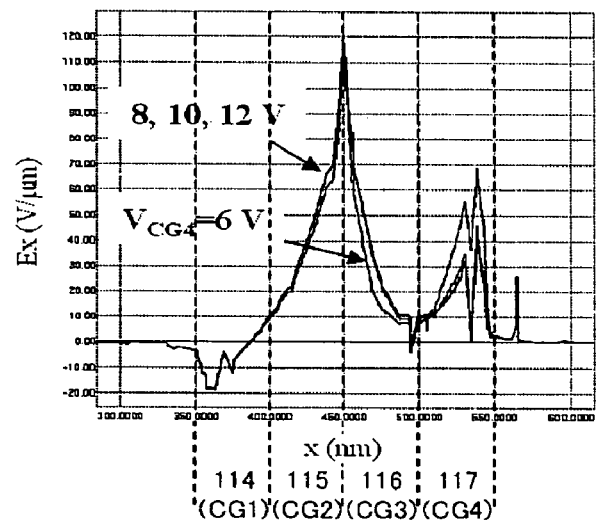
Figure 4C:
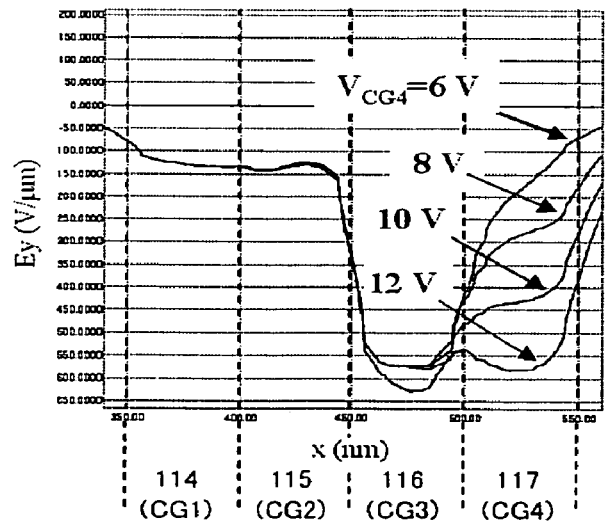

FIG. 4A to FIG. 4C are graphs, showing results of device simulations, which are conducted for investigating an influence of electrical voltage $V_{CG4}$ across the fourth control gate 117 over an electric potential distribution and a field strength distribution in the nonvolatile memory device 100 during the process for writing data onto the third memory region 106c under the third control gate 116.

Here, electrical voltages applied to the first control gate 114, the second control gate 115 and the third control gate 116 were set to $V_{CG1}$=1.5 V, $V_{CG2}$=3.0 V and $V_{CG3}$=12.0 V, respectively. Moreover, electrical voltages applied to the second impurity-diffused region 160b and the first impurity-diffused region 160a were set to a higher voltage (4.5 V) and a lower voltage (0 V), respectively, and the silicon substrate 102 was grounded. Next, voltages of 6.0 V, 8.0 V, 10.0 V or 12.0 V were selected for electrical voltages $V_{CG4}$ applied to the fourth control gate 117.

FIG. 4A is a graph, showing an influence of electrical voltage $V_{CG4}$ across the fourth control gate 117 over the relationship of the location of each control gate with the surface potential. When an electrical voltage of 12.0V, which is the same as that applied to the third control gate 116, (or 10.0 V) was applied to the fourth control gate 117, the obtained surface potential of the third control gate 116 was almost the same as that of the fourth control gate 117. Similarly, when an electrical voltage applied to the fourth control gate 117 was selected as 8.0 V, the obtained surface potential of the third control gate 116 was almost the same as that of the fourth control gate 117. Although a difference in surface potential was occurred between the second control gate 115 and the third control gate 116 when an electrical voltage applied to the fourth control gate 117 was selected as 6.0 V, no considerable change was created in gradient in the surface potential in vicinity of the boundary between the control gate 115 and the control gate 116.

FIG. 4B is a graph, showing an influence of electrical voltage $V_{CG4}$ across the fourth control gate 117 over the relationship of field strength Ex in the transverse direction in the silicon substrate 102 with a position of each control gate in a location spaced apart by 1 nm from an interface between the silicon substrate 102 and the silicon oxide film formed thereon. There was almost no difference in values of Ex in vicinity of the boundary between the control gate 115 and the control gate 116, regardless of values of $V_{CG4}$.

FIG. 4C is a graph, showing an influence of electrical voltage $V_{CG4}$ across the fourth control gate 117 over the relationship of field strength Ey in the longitudinal direction in the silicon oxide film and a position of each control gate in a location spaced apart by 1 nm from an interface between the silicon substrate 102 and the silicon oxide film formed thereon. Ey in a region under the fourth control gate 117 was increased as $V_{CG4}$ increases, so that a difference thereof with Ey in a region under the third control gate 116 was reduced. When $V_{CG4}$ was set to 12.0 V that is the same as $V_{CG3}$, Ey of the region under the fourth control gate 117 was almost the same as Ey in the region under the third control gate 116. In order to selectively inject an electron into the third memory region 106c under the third control gate 116, it is necessary to selectively increase the field strength Ey in the region under the third control gate 116 and to reduce the field strength Ey in the longitudinal direction in the region under the fourth control gate 117 as possible to prevent an electron from being injected into the fourth memory region 106d. In view of such relationship, it is preferable to suitably select electrical voltage $V_{CG4}$ applied to the fourth control gate 117 so as to be lower than electrical voltage $V_{CG3}$ applied to the third control gate 116. In the present embodiment, electrical voltage $V_{CG4}$ applied to the fourth control gate 117 may be set to, for example, 6.0V.

On the other hand, it was demonstrated that when slightly lower electrical voltage $V_{CG4}$ applied to the fourth control gate 117 than 6.0 V is employed, or more specifically, for example, when electrical voltage 1.5V or 3.0V as employed for $V_{CG1}$ and $V_{CG2}$ are employed, the surface potential in the silicon substrate 102 under the fourth control gate 117 is reduced and the surface potential in the silicon substrate 102 under the third control gate 116 is also reduced. If the surface potential in the silicon substrate 102 under the third control gate 116 is reduced, electric potential gradient in vicinity of the boundary between the second control gate 115 and the third control gate 116, or namely field strength Ex in the transverse direction, is reduced, such that efficient injection of electron into the third memory region 106c can not be achieved. In view of the foregoing, it is preferable to increase the electrical voltage applied to the fourth control gate 117 to a certain extent, so that sufficiently higher surface potential in the silicon substrate 102 under the third control gate 116 be maintained.

Figure 5A:
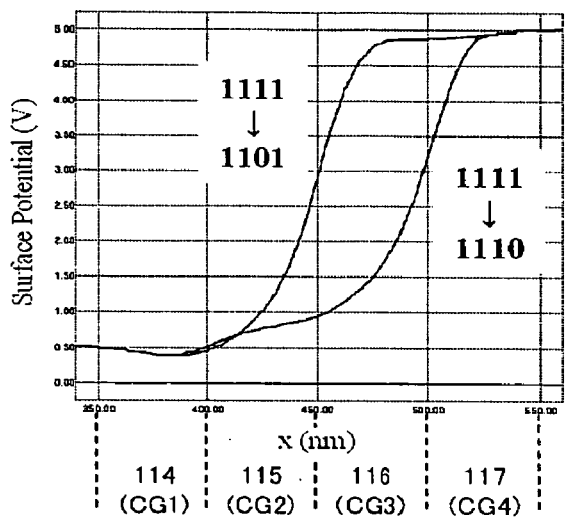
FIG. 5A to FIG. 5C are graphs, showing results of device simulations, which are conducted for investigating an electric potential distribution and a field strength distribution in the nonvolatile memory device, when the electrical voltage applied to each control gate is adequately established.
Figure 5B:
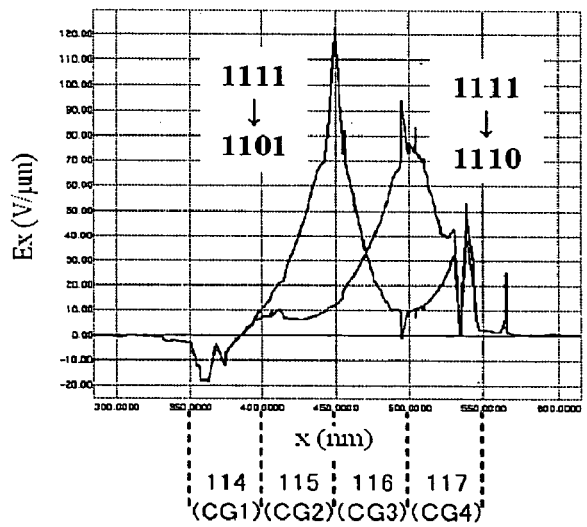
Figure 5C:
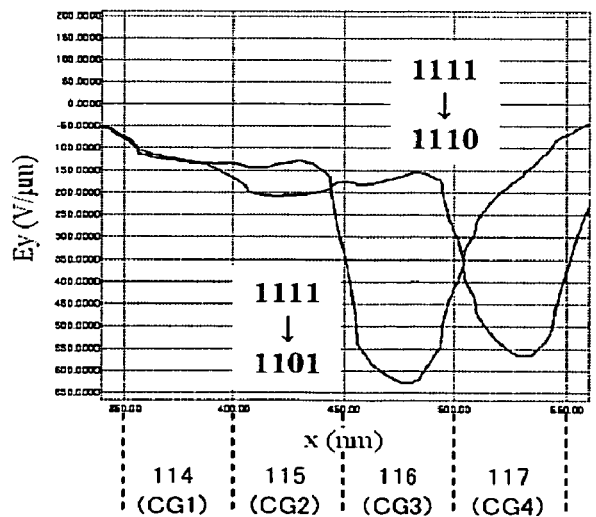

FIG. 5A to FIG. 5C are graphs, showing results of device simulations, which were conducted for investigating an electric potential distribution and a field strength distribution in the nonvolatile memory device 100, when the electrical voltage applied to each control gate is adequately established. FIG. 5A shows a relationship of the surface potential with positions of respective control gates. FIG. 5B shows a relationship of the field strength Ex in the transverse direction in the silicon substrate 102 with positions of respective control gates, in a location spaced apart by 1 nm from an interface between the silicon substrate 102 and the silicon oxide film formed thereon. FIG. 5C shows a relationship of field strength Ey in the longitudinal direction in the silicon oxide film with positions of respective control gates, in a location spaced apart by 1 nm from an interface between the silicon substrate 102 and the silicon oxide film formed thereon.

In the graphs, a numeral such as "1111" or "1110" indicates a status of storing 4 bit data, and more specifically, a status without injecting an electron to the memory region (erasing status) is assigned as "1", and a status with injecting an electron to the memory region (writing status) is assigned as "0". Moreover, "1111→1110" indicates a writing operation for injecting an electron into the fourth memory region 106d of the memory cell, which has been in a status of whole bit-erased. Similarly, "1111→1101" indicates a writing operation for injecting an electron into the third memory region 106c of the memory cell, which has been in a status of whole bit-erased. Similar operations are indicated by other numerals.

When an electron is injected into the fourth memory region 106d under the fourth control gate 117 (1111→1110), electrical voltages were set as: $V_{CG1}$=1.5 V; $V_{CG2}$=3.0 V; $V_{CG3}$=3.0 V; and $V_{CG4}$=12.0 V. As a result, higher surface potential can be provided to the region under the fourth control gate 117, as compared with the surface potential of region under the third control gate 116, and field strength Ex and Ey in the region under the fourth control gate 117 can be selectively enhanced.

Moreover, when electron is injected into the third memory region 106c under the third control gate 116 (1111→1101), electrical voltages were set as: $V_{CG1}$=1.5 V; $V_{CG2}$=3.0 V; $V_{CG3}$=12.0 V; and $V_{CG4}$=6.0 V. As a result, higher surface potential can be provided to the region under the third control gate 116, as compared with the surface potential of region under the second control gate 115, and field strength Ex and Ey in the region under the third control gate 116 can be selectively enhanced. This configuration provides selective injection of electron to the third memory region 106c.

Next, the above-described operation (c) and operation (d) will be described in reference to FIG. 6. Data codes that can be stored in memory region of 4 bits is composed of 16 types of codes, namely, "1111", "1110", "1101", "1100", "0110", "0101", "1001", "0100", "1000", "0111", "1011", "0011", "1010", "0010", "0001" and "0000", provided that a status without injecting an electron is assigned as 1, and a status with injecting an electron is assigned as 0. As shown in FIG. 6, among these codes, the following codes "0111", "1011", "0011", "1010", "0010" and "0001" may be created by applying electrical voltages that are symmetric to "1111", "1110", "1101", "0101", "0100" and "1000", respectively. More specifically, an electrical voltage arrangement for applying voltages to the first impurity-diffused region 160a and the second impurity-diffused region 160b may be inversed, and an electrical voltage arrangement for applying voltages to the four control gates 114 to 117 may also be inversed. Then, methods for generating nine types of data codes except "0111", "1011", "0011", "1010", "0010" and "0001" will be described as follows.

FIG. 7 shows a table, including nine types of the above-described data codes and procedures for injecting electron to each of memory regions. Here, an electrical voltage applied to the first impurity-diffused region 160a is defined as $V_S$, and an electrical voltage applied to the second impurity-diffused region 160b is defined as $V_D$. In any case, the initial state is a whole erasing status "1111".

For example, when data code "1100" is generated, processes for injecting to the third memory region 106c and the fourth memory region 106d are required. In this case, two methods are available, including: a method for injecting an electron to the fourth memory region 106d to generate "1110" and then injecting an electron to the third memory region 106c to achieve "1110"→"1100"; and a method for injecting an electron to the third memory region 106c to generate "1101" and then injecting an electron to the fourth memory region 106d to achieve "1101"→"1100". More specifically, two procedures for injecting an electron: (1111→1110→1100) and (1111→1101→1100), are available, and even though any one of these procedures is employed, the fourth memory region in the former or the third memory region in the latter are in the status of writing data in the first electron injection stage. Accordingly, in order to control of the writing electric current in at a desired value while making use of characteristics of the source side injection process in the second electron injection stage (1110→1100 in the former or 1101→1100 in the latter), similarly as in the first time electron injection stage. Electrical voltages applied to the control gates should be optimized in view of status of the writing data in the respective memory regions.

While any of the above-described two procedures for injecting electron can be selected, an exemplary implementation employing the latter method (1111→1101→1100) will be illustrated in the present embodiment.

On the other hand, when data code of, for example, "0100" is generated, processes for injecting an electron to the first memory region 106a, the third memory region 106c and the fourth memory region 106d are required. In such case, various procedures are also available. For example, an operation of three-step writing in a sequence of "1111"→"1101"→"1100"→"0100" may be conducted.

Besides: when data code of, for example, "0110" is generated, a sequence of "1111"→"1110"→"0110" may be employed; when data code "0101" is generated, a sequence of "1111"→"1101"→"0101" may be employed; when data code "1001" is generated, a sequence of "1111"→"1101"→"1001" may be employed; when data code "1000" is generated, a sequence of "1111"→"1101"→"1100"→"1000" may be employed; and when data code "0000" is generated, a sequence of "1111"→"1111"→"1100"→"1000"→"0000" may be employed. The sequences described above are presented for the purpose of an illustration only, and a different procedure may alternatively by employed.

FIG. 8 includes a table, showing relationships between changes in data code in 4 bits/cell and corresponding electrical voltages applied to respective control gates. In the table, exemplary electrical voltages applied to the respective electrodes in the data-writing operation for generating the above-described data codes are shown. Respective electrical voltages are changed in accordance with a design specification such as writing current and the like. In this case, an example of setting the writing current in each of the writing operations as about 1 µA/cell is presented. Since it is necessary to appropriately establish electrical voltages applied to respective control gates when an electron is injected in a memory region, depending on whether an electron is trapped by other memory region or not, applied voltages to the four control gates were determined by utilizing a device simulator. As such, an electrical voltage is optimized depending on a status of accumulating electron in the memory cell before and after the writing operation, such that reduced power consumptions and increased writing rates in respective steps of the electron injection process can be achieved.

Here, electrical voltages applied to the first control gate 114, the second control gate 115, the third control gate 116 and the fourth control gate 117 are defined as $V_{CG1}$, $V_{CG2}$, $V_{CG3}$ and $V_{CG4}$, respectively.

In addition to above, even in any of the cases, respective electrical voltages are set as follows:

when an electron is injected to the fourth memory region 106d: $V_{CG1} \leq V_{CG2} \leq V_{CG3} << V_{CG4}$; and when an electron is injected to the third memory region 106c: $V_{CG1} \leq V_{CG2} < V_{CG4} << V_{CG3}$.

Here, by setting the voltages as $V_{CG4} \approx (\frac{1}{2})V_{CG3}$, an injection of an electron to the fourth memory region 106d can be inhibited to provide a selective injection of an electron only to the third memory region 106c.

As described above, the procedure for injecting electron for respective data codes is previously established, and electron is injected according to the previously established procedure, such that a desired data code can be generated.

Figure 9A:
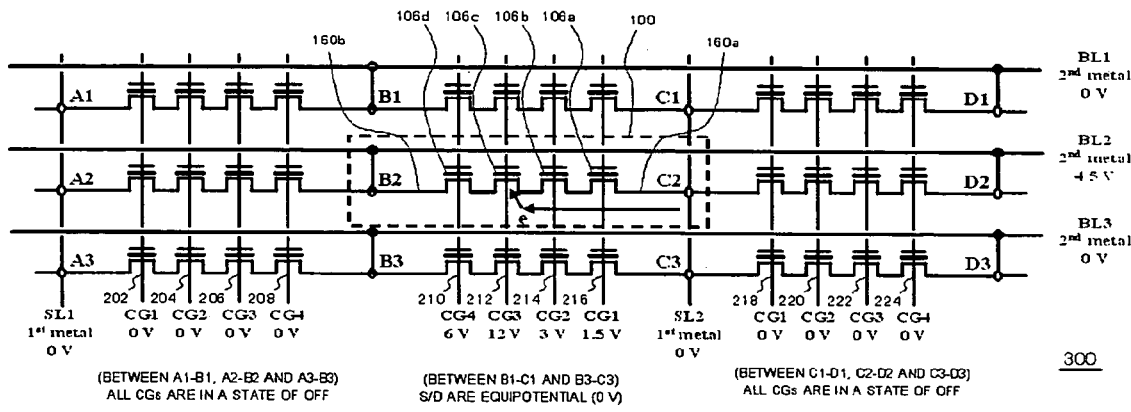
FIG. 9A and FIG. 9B are diagrams, showing structures of nonvolatile storage devices according to the present embodiment, which are memory cell arrays including a plurality of groups composed of an a plurality of nonvolatile memory devices.
Figure 9B:
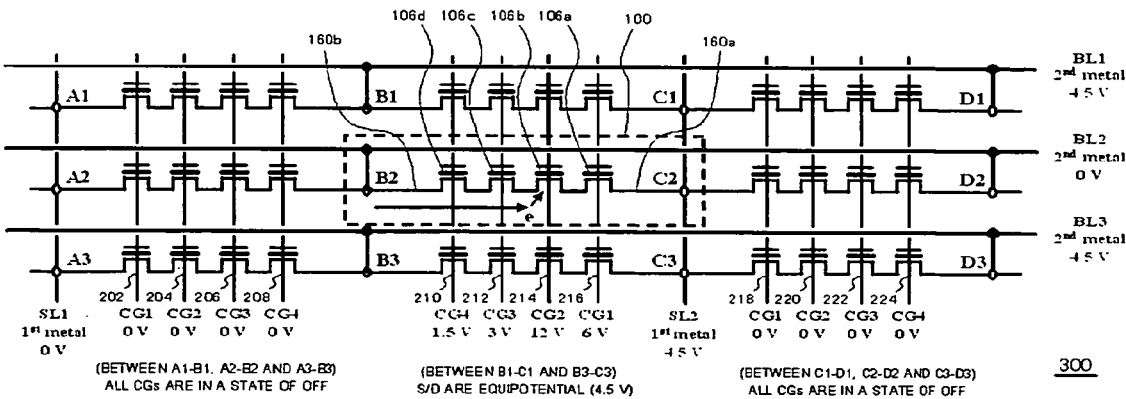
Figure 10:
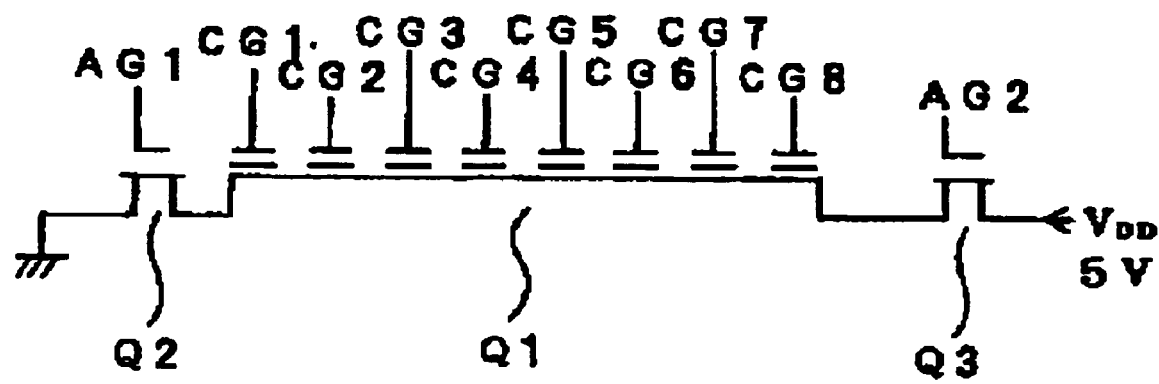
FIG. 10 is a circuit schematic of a conventional nonvolatile memory device.

FIG. 9A and FIG. 9B are diagrams, each showing a structures of a nonvolatile storage device according to the present embodiment, which is a memory cell arrays including a plurality of groups composed of an a plurality of nonvolatile memory devices. A nonvolatile storage device 300 has a structure, in which, in respective memory cells, a first impurity-diffused region 160a is coupled to either of a plurality of source lines that are commonly owned by the memory cells arranged in the same column, a second impurity-diffused region 160b is coupled to either of a plurality of bit lines commonly owned by the memory cells arranged in the same row, and each of the four control gates is coupled to either one of a plurality of gate lines commonly owned by the memory cells arranged in the same row.

A method for controlling of the nonvolatile storage device 300 having such structure includes: selecting a target memory cell that is a target for writing data; setting electrical voltages respectively applied to a plurality of bit lines, a plurality of source lines and a plurality of gate lines, so that predetermined electrical voltages are applied to the first impurity-diffused region 160a and the second impurity-diffused region 160b included in the target memory cell and to the four control gates and so that electron is not injected to the memory regions included in other memory cells; and applying a set electrical voltages to a plurality of bit lines, a plurality of source lines and a plurality of gate lines. More specific descriptions will be made as follows.

As shown in FIG. 9A, the nonvolatile storage device 300 includes a plurality of memory cells, a plurality of bit lines BL1, BL2 and BL3, a plurality of source lines SL1 and SL2 and a plurality of gate lines 202 to 224.

The second impurity-diffused regions 160b of the respective memory cells are coupled to either of the bit lines BL1 to BL3, and the first impurity-diffused regions 160a are coupled to either of the source lines SL1 and SL2. The gate lines 202 to 224 are commonly owned by respective groups of the memory cells arranged in the same lines along a longitudinal direction in the diagram.

Hereinafter, descriptions of the nonvolatile memory device 100 enclosed by a broken line in the diagram will be made. The second impurity-diffused region 160b of the nonvolatile memory device 100 is connected to the bit line BL2 at a contact B2. The first impurity-diffused region 160a of the nonvolatile memory device 100 is connected to the source line SL2 at a contact C2. Further, the control gates of the nonvolatile memory device 100 are connected to the gate lines 210 to 216.

If the nonvolatile memory device 100 is selected as a target memory cell that is a target for writing data and the gate line 212 of the nonvolatile memory device 100 is selected as a data-writing target, respective electrical voltages are determined as follows.

As shown in FIG. 9A, the setting of the electrical voltages are determined, so that a higher voltage (4.5 V) is applied to the bit line BL2 and a lower voltage (0 V) is applied to the source line SL2, so as to create a lower electric potential in the first impurity-diffused region 160a and a higher potential in the second impurity-diffused region 160b. A lower voltage (0 V) is applied to each of other bit lines BL1 and BL3. A lower voltage (0 V) is also applied to the other source line SL1. Moreover, predetermined electrical voltages are applied to the gate lines 210 to 216 connected to the nonvolatile memory device 100, as have been respectively described in reference to FIGS. 3A to 3D. More specifically, a voltage of 12 V is applied to the gate line 212 (CG3) on the third memory region 106c that is a writing target, a voltage of 6 V is applied to the gate line 210 (CG4), and voltages of 3 V and 1.5 V are applied to the gate lines 214 (CG2) and 216 (CG1), respectively. Moreover, the gate lines 202 to 208, which are not connected to the nonvolatile memory device 100, and the gate lines 218 to 224, are all grounded. This configuration provides that data can be written to the third target memory region 106c in a plurality of memory cells of the target nonvolatile memory device 100.

On the other hand, when the nonvolatile memory device 100 is selected as a target memory cell that is a target for writing data, and the gate line 214 of the nonvolatile memory device 100 is selected as a data-writing target, respective electrical voltages are determined as follows.

As shown in FIG. 9B, the setting of the electrical voltages are determined, so that a lower voltage (0 V) is applied to the bit line BL2 and a higher voltage (4.5 V) is applied to the source line SL2, so as to create a higher electric potential in the first impurity-diffused region 160a and a lower potential in the second impurity-diffused region 160b. A higher voltage (4.5 V) is applied to each of other bit lines BL1 and BL3. A lower voltage (0 V) is applied to the other source line SL1. Moreover, predetermined electrical voltages are applied to the gate lines 210 to 216 connected to the nonvolatile memory device 100, as have been respectively described in reference to FIGS. 3A to 3D. More specifically, a voltage of 12 V is applied to the gate line 214 (CG2) on the second memory region 106b that is a writing target, a voltage of 6 V is applied to the gate line 216 (CG1), and voltages of 3 V and 1.5 V are applied to the gate lines 212 (CG3) and 210 (CG4), respectively. Moreover, the gate lines 202 to 208, which are not connected to the nonvolatile memory device 100, and the gate lines 218 to 224, are all grounded.

The above-described method for controlling voltages provides that data can be written to the second target memory region 106b in a plurality of memory cells of the target nonvolatile memory device 100.

In addition to above, the voltage-applying pattern for writing data to the target memory region of the target memory cell can be previously set to establish an optimized condition, according to the above-described procedure. In this case, according to the selected memory cell and memory region, electrical voltages are applied to the respective bit lines, the respective source lines and the respective gate lines according to the previously-established voltage-applying pattern.

Next, a procedure for reading data that have been written on the respective memory region will be described. When data is read out from respective memory regions 106a to 106d in the present embodiment, one of the first impurity-diffused region 160a and the second impurity-diffused region 160b, which is closer to a read-out target memory region, is grounded to provide a function as a source, and the other thereof is utilized as a drain and is applied with an electrical voltage of around 1 V. Next, an electrical voltage of a level that is capable of substantially offset the data writing status (5 V, for example) is applied to the control gates in three memory regions except the read-out target memory region, thereby achieving the respective regions in "ON" state. Finally, an electrical voltage (1.5 V, for example), which is higher than a threshold voltage in an erasing status for this region and sufficiently lower than the electrical voltage applied to the control gates of the above-described three memory regions, is applied to the control gate of the read-out target memory region. If the read-out target memory region is in an erasing status, a desired electron current flows into the drain from the source, and on the other hand, if the read-out target memory region is in a writing status, such electron current does not flow, and therefore the writing/erasing status of the read-out target memory region can be determined. By executing the above-mentioned operations for respective memory regions, a single data code can be recognized. Here, in the read-out operation, the four control gates are classified into a first control gate group composed of N/2 control gates arranged in a side of the first impurity-diffused region 160a and a second control gate group composed of N/2 control gates arranged in a side of the second impurity-diffused region 160b, and when a control gate that is a counterpart to a read-out target memory region is included in the first control gate group, the first impurity-diffused region 160a is grounded to provide a function as a source and a read-out electrical voltage is applied to the second impurity-diffused region 160b to provide a function as a drain, and when a control gate that is a counterpart to a read-out target memory region is included in the second control gate group, a read-out electrical voltage is applied to the first impurity-diffused region 160a to provide a function as a drain, and the second impurity-diffused region 160b is grounded to provide a function as a source. Under such condition, a predetermined electrical voltage is applied to the control gates other than the control gate that is a counterpart to a read-out target memory region to achieve these regions in "ON" state, and the control gate that is a counterpart to a read-out target memory region is applied with a lower electrical voltage that is lower than voltages applied to other control gates. In this way, the status on whether the read-out target memory region is in the erasing status or not can be determined, based on whether electron current flows to the drain from the source.

While the preferred embodiments of the present invention have been described above in reference to the annexed figures, it should be understood that the disclosures above are presented for the purpose of illustrating the present invention, and various configurations other than the above described configurations can also be adopted.

The configuration of the nonvolatile memory device 100 is not limited to that described in the preferred embodiment, and various geometries and configurations may be employed.

Figure 11A:
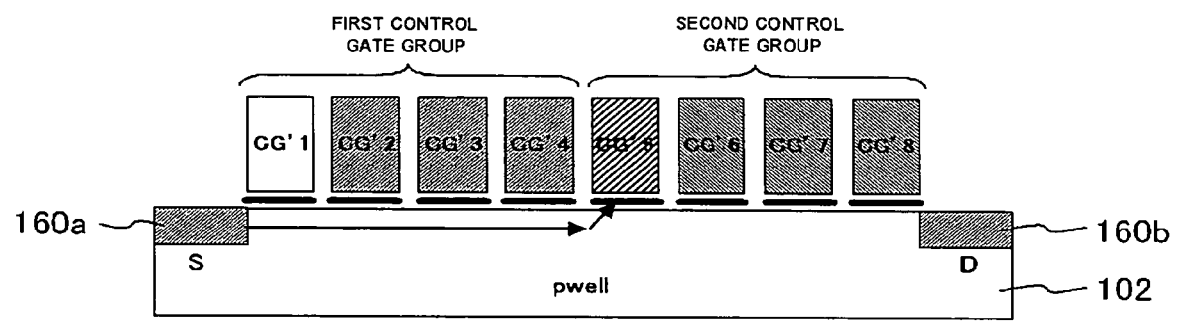
FIGS. 11A and 11B are schematic cross-sectional views of a semiconductor device, illustrating a configuration that the nonvolatile memory device is designed for 8 bit/cell.
Figure 11B:
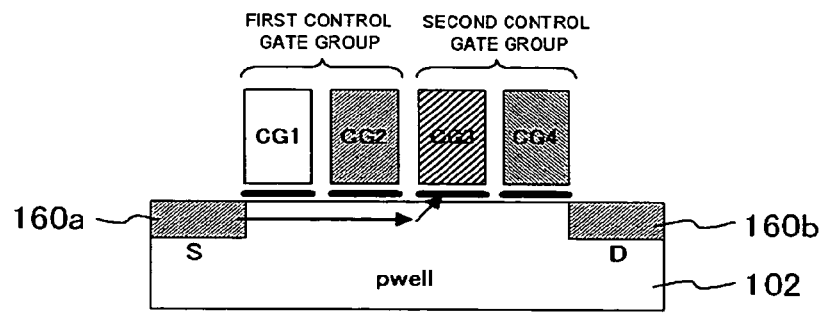

The nonvolatile memory device 100 may include N control gates where N is an even number of not smaller than four. While the exemplary implementation of the case of N=4 has been described in the above-mentioned embodiment, when nonvolatile memory device 100 includes further more control gates, similar procedure may be conducted. FIG. 11A is a schematic cross-sectional view of a semiconductor device, illustrating a configuration that the nonvolatile memory device 100 includes eight memory regions and eight control gates, each of which is a counterpart to each of the memory regions, respectively. FIG. 11B is a schematic cross-sectional view of a semiconductor device, illustrating a configuration that the nonvolatile memory device 100 includes four control gates.

When the nonvolatile memory device 100 includes eight control gates, these eight control gates may be classified so that CG'1, CG'2, CG'3 and CG'4 are categorized as the first control gate group and CG'5, CG'6, CG'7 and CG'8 are categorized as the second control gate group. When, for example, an electron is injected to CG'5, the first impurity-diffused region 160a is set to be in a lower electric potential and the second impurity-diffused region 160b is set to be in a higher potential. Moreover, an electrical voltage, which is the same as the electrical voltage applied to CG1 in the process for injecting an electron to CG3 when the nonvolatile memory device 100 includes four control gates, is applied to CG'1. Further, an electrical voltage that is the same as applied to CG2 in FIG. 11B is applied to CG'2, CG'3 and CG'4, and an electrical voltage that is the same as applied to CG4 in FIG. 11B is applied to CG'6, CG'7 and CG'8. This can also be utilized to inject an electron to the target memory element.

It is apparent that the present invention is not limited to the above embodiment, that may be modified and changed without departing from the scope and spirit of the invention.

What is claimed is:

1. A method for controlling a nonvolatile memory device, said nonvolatile memory device comprising:
   a semiconductor substrate; and
   a memory cell including:
   first and second impurity-diffused regions provided separately and spaced from each other at the surface of said semiconductor substrate;
   first to Nth control gates, where N is an even number of not smaller than four, being disposed in parallel with each other between said first impurity-diffused region and said second impurity-diffused region in this order on said semiconductor substrate; and
   first to Nth memory regions, respectively being provided between said semiconductor substrate and said first to said Nth control gates,
   said method comprising:
   (a) classifying said first to Nth control gates into a first control gate group composed of first to N/2th control gates arranged in a side of said first impurity-diffused region and a second control gate group composed of (N/2+1)th to Nth control gates arranged in a side of said second impurity-diffused region, and then applying a first higher voltage to said first impurity-diffused region and applying a first lower voltage to said second impurity-diffused region when a target control gate corresponding to a target memory region for injecting an electron is included in said first control gate group, and applying a second lower voltage to said first impurity-diffused region and applying a second higher voltage to said second impurity-diffused region when said target control gate is included in said second control gate group; and
   (b) applying a third higher voltage to said target control gate, while the condition of applying said voltages to said first and said second impurity-diffused regions is maintained, so that electron is injected to said target memory region that is corresponding to said target control gate, said third higher voltage being higher than voltages applied to other control gates.

2. The method for controlling the nonvolatile memory device according to claim 1, wherein in said (b), if a control gate other than said target control gate is disposed between said impurity-diffused region that is applied with said first or second higher voltage and said target control gate, applying a fourth higher voltage to said control gate disposed between said impurity-diffused region that is applied with said first or second higher voltage and said target control gate, said fourth higher voltage being higher than voltages applied to said control gates disposed between said impurity-diffused region that is applied with said first or second lower voltage and said target control gate.

3. The method for controlling the nonvolatile memory device according to claim 1, wherein said first control gate is provided to be adjacent to said first impurity-diffused region, and wherein in said (b), when said first impurity-diffused region is applied with said second lower voltage, a third lower voltage is applied to said first control gate, said third lower voltage being lower than a voltage applied to other control gates included in said first control gate group.

4. The method for controlling the nonvolatile memory device according to claim 2, wherein said first control gate is provided to be adjacent to said first impurity-diffused region, and wherein in said (b), when said first impurity-diffused region is applied with said second lower voltage, a third lower voltage is applied to said first control gate, said third lower voltage being lower than a voltage applied to other control gates included in said first control gate group.

5. The method for controlling the nonvolatile memory device according to claim 1, wherein said Nth control gate is provided to be adjacent to said second impurity-diffused region, and wherein in said (b), when said second impurity-diffused region is applied with said first lower voltage, a fourth lower voltage is applied to said Nth control gate, said fourth lower voltage being lower than a voltage applied to other control gates included in said second control gate group.

6. The method for controlling the nonvolatile memory device according to claim 2, wherein said Nth control gate is provided to be adjacent to said second impurity-diffused region, and wherein in said (b), when said second impurity-diffused region is applied with said first lower voltage, a fourth lower voltage is applied to said Nth control gate, said fourth lower voltage being lower than a voltage applied to other control gates included in said second control gate group.

7. The method for controlling the nonvolatile memory device according to claim 1, wherein said first to said Nth control gates in said nonvolatile memory device are arranged to be adjacent in this order such that only an insulating film is disposed between the adjacent control gates.

8. The method for controlling the nonvolatile memory device according to claim 2, wherein said first to said Nth control gates in said nonvolatile memory device are arranged to be adjacent in this order such that only an insulating film is disposed between the adjacent control gates.

9. The method for controlling the nonvolatile memory device according to claim 1, wherein said first to said Nth control gates in said nonvolatile memory device are symmetrically arranged in a cross-section in a gate length direction.

10. The method for controlling the nonvolatile memory device according to claim 2, wherein said first to said Nth control gates in said nonvolatile memory device are symmetrically arranged in a cross-section in a gate length direction.

11. The method for controlling the nonvolatile memory device according to claim 7, wherein said first to said Nth control gates in said nonvolatile memory device are symmetrically arranged in a cross-section in a gate length direction.

12. The method for controlling the nonvolatile memory device according to claim 1, further comprising:
  (c) determining a sequence for injecting electron to said first to said Nth memory regions, when injecting electron to said first to said Nth memory regions is required, corresponding to data code for being stored in said memory cell; and
  (d) sequentially selecting said target memory region for being injected with electron from said first to said Nth memory regions, according to the sequence determined in said determining the sequence for injecting electron,
  wherein said (a) and said (b) are conducted over the control gate corresponding to said target memory region selected in said (d).

13. The method for controlling the nonvolatile memory device according to claim 12, further comprising:
  (e) determining electrical voltages being applied to said first to said Nth control gates in said (b) before injecting electron into said target memory region selected in said (d), in view of a fact whether electron is injected into any other of said memory regions in the same memory cell or not, according to said injection sequence determined in said (c),
  wherein, in said (b), electrical voltages determined in said (e) are applied to said first to said Nth control gates.

* * * * *